United States Patent [19]

Gersdorf et al.

[11] Patent Number: 5,034,306
[45] Date of Patent: Jul. 23, 1991

[54] PHOTOCURABLE ELASTOMERIC MIXTURE AND RECORDING MATERIAL, OBTAINED THEREFROM, FOR THE PRODUCTION OF RELIEF PRINTING PLATES

[75] Inventors: Joachim Gersdorf, Wiesbaden; Matthias Kroggel, Kelkheim, both of Fed. Rep. of Germany

[73] Assignee: Hoechst Aktiengesellschaft, Frankfurt am Main, Fed. Rep. of Germany

[21] Appl. No.: 524,792

[22] Filed: May 18, 1990

[30] Foreign Application Priority Data

May 20, 1989 [DE] Fed. Rep. of Germany ........ 3916463

[51] Int. Cl.$^5$ .............................................. G03C 1/725
[52] U.S. Cl. ..................................... 430/284; 430/281; 430/306; 430/906; 525/63; 528/75
[58] Field of Search ............... 430/284, 281, 906, 306; 525/63; 528/75

[56] References Cited

U.S. PATENT DOCUMENTS

| | | | |
|---|---|---|---|
| 3,630,746 | 12/1971 | Takimoto et al. | 96/115 |
| 3,936,254 | 2/1976 | Sawada et al. | 425/89 |
| 4,042,386 | 8/1977 | Okai et al. | 96/35.1 |
| 4,423,135 | 12/1983 | Chen et al. | 430/271 |
| 4,493,807 | 1/1985 | Vyvial et al. | 264/101 |

FOREIGN PATENT DOCUMENTS

65535/86  5/1987 Australia .
3824146  2/1990 Fed. Rep. of Germany .

Primary Examiner—Jack P. Brammer
Attorney, Agent, or Firm—Foley & Lardner

[57] ABSTRACT

A photocurable elastomeric mixture is described which contains a photopolymerization initiator; as binder, a graft polymer which is soluble or dispersible in water or an aqueous solution, the graft backbone of which is a polymer of diol components and diisocyanate components having at least 2 urethane groups in the molecule, onto which polymer chains of units of carboxylic acid vinyl esters having about 3 to 20 carbon atoms or their saponification products and optionally of further ethylenically unsaturated monomers or their saponification products are grafted; and at least one compound which is polymerizable by a free-radical polymerization and corresponds to the general formula

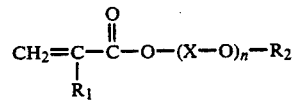

wherein
$R_1$ denotes hydrogen or alkyl,
X denotes ethylene or propylene,
$R_2$ denotes alkyl and
n is a number from 1 to 4.

The mixture is suitable for the production of soft-elastic relief printing plates, in particular flexographic printing plates, can be developed with water or aqueous solutions, and has a Shore A hardness of 40 to 70.

18 Claims, No Drawings

PHOTOCURABLE ELASTOMERIC MIXTURE AND RECORDING MATERIAL, OBTAINED THEREFROM, FOR THE PRODUCTION OF RELIEF PRINTING PLATES

The invention relates to a photocurable, negative-working mixture and to a recording material, obtained therefrom, which is suitable for the production of elastic relief printing plates.

Mixtures of the said generic type are known and usually contain an elastomeric binder, a compound which can be polymerized by free radical polymerization and a polymerization initiator which can be activated by actinic radiation. After exposure, mixtures of this type, which for example, are described in DE-C 22 15 090, can be developed only with organic solvents to give a relief image.

In U.S. Pat. No. 4,042,386 and in DE-B 19 02 639 and DE-B 19 17 917 (combined in U.S. Pat. No. 3,630,746) and in DE-B 24 02 808 photosensitive recording materials which are based on partially saponified polyvinyl acetate and can be developed in an aqueous medium are described for the production of relief printing plates, but an addition of water is needed for homogenization and layer formation, which makes a subsequent drying process necessary. Furthermore, these relief printing forms do not have the high elasticity or low Shore A hardness necessary for flexographic printing.

In DE-A 35 41 162 (=AU 86/65,535) and EP-B 0 080 664 (=U.S. Pat. No. 4,493,807) internally plasticized, partially saponified polyvinyl acetates are described as binders for photosensitive recording materials. These graft polymers, which are obtained by polymerization of vinyl esters in the presence of polyalkylene oxides and subsequent partial saponification, are indeed more elastic than pure partially saponified polyvinyl acetates, but the addition of water is likewise necessary when the corresponding photopolymer mixtures are processed into sheet-like recording materials.

In the prior German Patent Application P 38 24 146.3 (U.S. Ser. No. 07/379,946) graft polymers which are soluble or dispersible in water or aqueous solutions are disclosed as binders for photosensitive recording materials where the graft backbone chain is a polymer comprised of diol components and diisocyanate components, having at least two urethane groups in the polymer, onto which polymer chains of units of carboxylic acid vinyl esters having 3 to 20 carbons atoms or of their saponification products and optionally of further ethylenically unsaturated monomers or of their saponification products are grafted. The photopolymerizable mixtures based on the photomonomers disclosed in this publication can be processed into sheet-like recording materials using thermoplastic methods. The resulting recording materials are, however, too hard for certain uses, e.g., flexographic printing. Relief printing plates used for flexographic printing shall in particular be soft-elastic plates having Shore A hardness values of 40 to 65.

SUMMARY OF THE INVENTION

Accordingly, it is an object of the present invention to provide a photosensitive elastomeric mixture which can be developed in water or aqueous solutions and which can be shaped without the addition of water, by thermoplastic processing, into a photosensitive layer, and from which a soft-elastic relief printing plate can be produced.

Another object of the present invention is to provide a photocurable recording material having a photocurable layer comprising the foregoing mixture.

In accomplishing the foregoing objectives, there has been provided, in accordance with one aspect of the present invention, a photocurable elastomeric mixture comprising: an elastomeric graft polymer binder which is soluble or dispersible in water or aqueous solution and which comprises a graft backbone, comprising a plurality of diol and diisocyanate units, having at least 2 urethane groups, and a plurality of carboxylic acid vinyl ester units having about 3 to 20 carbon atoms, or saponification products thereof, grafted to the graft backbone; at least one compound comprising at least one terminal ethylenically unsaturated group and having a boiling point at normal pressure of above 100° C., which is polymerizable by free-radical polymerization and which is compatible with the binder; a compound or combination of compounds capable of initiating polymerization of the free-radical polymerizable compound or compounds under the action of actinic radiation, wherein at least one of the foregoing free-radical polymerizable compounds corresponds to the formula

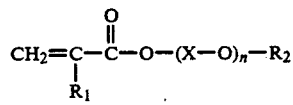

where
$R_1$ denotes hydrogen or alkyl,
X denotes ethylene or propylene,
$R_2$ denotes alkyl and
n is a number from 1 to 4.

In accordance with another aspect of the present invention there is provided a photocurable recording material comprising a layer support and a photocurable layer comprising the foregoing photocurable mixture.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

In a preferred embodiment of the mixture according to the present invention,
$R_1$ denotes hydrogen or ($C_1$ to $C_3$)alkyl, in particular hydrogen or methyl
X denotes ethylene or isopropylene and
$R_2$ denotes ($C_1$ to $C_3$) alkyl, in particular methyl or ethyl.

The compounds of the above general formula which are polymerizable by a free-radical process and are used in accordance with this invention are mono- or oligoalkylene glycol monoalkylether acrylates or methacrylates which surprisingly give softer photocrosslinked layers than the hydroxyl-containing mono- or oligoalkylene glycol monoacrylates or monomethacrylates. They are synthesized in a known manner, for example by esterification of acrylic or methacrylic acid or by transesterification of the corresponding methyl esters with mono- or oligoalkylene glycol alkyl ethers, such as ethylene glycol monomethyl ether, diethylene glycol monomethyl ether, diethylene glycol monoethyl ether, triethylene glycol monomethyl ether and propylene glycol monomethyl ether.

It is particularly surprising that even in a direct comparison the oligoalkylene glycol monoalkyl ether acrylates or methacrylates employed according to this invention exhibit considerable advantages over the corresponding polyalkylene compounds. For example, no haze is discovered in photopolymer layers produced employing the mixtures of this invention compared to layers containing the corresponding polyalkylene compounds.

The monomers of the above general formula which are employed in accordance with this invention can also be used in admixture with other monomers having several polymerizable olefinic double bonds, in order to achieve good crosslinking.

Suitable are, in particular, esters or amides of acrylic acid and methacrylic acid. Examples are the diacrylates and triacrylates, dimethacrylates and trimethacrylates of polyhydric alcohols such as ethylene glycol, di-, tri-, tetra- or polyethylene glycols, the latter preferably having about 10 to 15 ethylene glycol units, 1,3-propanediol, glycerol, 1,1,1-trimethylolpropane, 1,2,4-butanetriol or pentaerythritol, for example ethylene glycol dimethacrylate, triethylene glycol diacrylate, trimethylolpropane triacrylate and trimethylolpropane trimethacrylate. Preference is, however, given to mixtures which exclusively contain monomers of the general formula, and among these particular preference is given to those containing one monomer. If the mixture according to this invention contains monomer mixtures, the ratio of the monomers corresponding to the general formula to other suitable monomers mentioned is between about 2:1 and 25:1, particularly between 5:1 and 20:1. In general, the amount of monomers is about 5 to 70% by weight, preferably about 10 to 50% by weight, relative to the non-volatile constituents of the mixture.

The photocurable elastomeric mixture according to this invention has a Shore A hardness of about 40 to 70, in particular of 45 to 65.

The graft polymer contained as binder in the mixture according to this invention is described in the prior German Patent Application P 38 24 146.3, corresponding to U.S. Ser. No. 07/379,946, the contents of which are hereby incorporated by reference.

The amount of grafted-on components in the binder is in general about 10 to 95% by weight, preferably 30 to 90% by weight, and particularly preferably 40 to 80% by weight, relative to the total graft polymer.

The graft backbones consist of polyurethane having at least two urethane groups in the molecule, the number of urethane groups per molecule being subject to no particular upper limit and in general having values higher than 2.

The polyurethanes employed as graft backbones can be produced from diols and diisocyanates by conventional processes of polyurethane synthesis and are preferably synthesized at temperatures between 60° and 120° C., preferably between 70° and 100° C., using catalysts, for example tertiary amines or organic tin compounds.

In principle, all of the diols customarily used in polyurethane synthesis can be employed. Cycloaliphatic diols, such as cyclohexanediols, and also aliphatic diols having preferably about 2 to 12 carbon atoms are preferred. Polyetherdiols, for example polypropylene oxides, polybutylene oxides and copolymers of ethylene oxide, propylene oxide and butylene oxide, preferably the block copolymers thereof, are also preferred; polyethylene oxides are particularly preferred. Polyetherdiols, in particular polyethylene glycols, with molecular weights of between about 200 and 10,000 are preferably used, polyethylene glycols with molecular weights of between 400 and 1,500 being particularly preferred. The polyetherdiols are optionally employed in combination with low-molecular aliphatic diols, for example 1,4-butanediol, 1,3-propanediol, ethylene glycol or diethylene glycol. The molar ratio of polyetherdiol to low-molecular aliphatic diol is preferably from about 1:0.1 to 1:0.7.

Diisocyanate components which can be employed are aromatic diisocyanates, for example m- and p-xylylene diisocyanate, tolylene-2,4-diisocyanate, tolylene-2,6-diisocyanate or mixtures of the latter two isomers, naphthylene-1,5-diisocyanate, diphenylmethane-4,4'-diisocyanate, phenyl benzyl ether 4,4'-diisocyanate and the like.

Aliphatic and/or cycloaliphatic diisocyanates are preferred. Preferred aliphatic diisocyanates are, for example, those having 2 to 12 carbon atoms in the aliphatic radical, for example ethylene diisocyanate, propylene diisocyanate, tetramethylene diisocyanate and 2,2,4-trimethylhexamethylene diisocyanate.

Preferred cycloaliphatic diisocyanates are, for example, 1,4-diisocyanato-cyclohexane, dicyclohexylmethane-4,4'-diisocyanateandisophorone diisocyanate. Hexamethylene diisocyanate and isophorone diisocyanate are particularly preferred.

The molar ratio of diol component to diisocyanate component is preferably between about 1:0.99 and 1:0.5, in particular between 1:0.98 and 1:0.7. The average molecular weights of the polyurethanes are preferably between about 200 and 100,000, in particular between 1,300 and 50,000 and particularly preferentially between 3,000 and 25,000.

Carboxylic acid vinyl esters having about 3 to 20 and preferably 4 to 14 carbon atoms are employed for grafting onto the polyurethane. Vinyl acetate and/or vinyl propionate, in particular vinyl acetate, are especially preferred. Mixtures of vinyl acetate and/or vinyl propionate and vinyl versatate are also preferred. In particular in the case of partial or complete saponification of the products following the graft polymerization, the co-use of vinyl propionate in addition to vinyl acetate during grafting is advantageous. Moreover, copolymerizable mixtures of carboxylic acid vinyl esters can be grafted, preferably mixtures of vinyl acetate and vinyl versatate, the proportion of vinyl versatate being about 0.2 to 10% by weight, preferably 0.5 to 5% by weight, relative to the proportion of vinyl acetate. Grafting with different carboxylic acid vinyl esters in the form of block copolymers, optionally in combination with further ethylenically unsaturated and copolymerizable monomers, can also be advantageous. Furthermore, the carboxylic acid vinyl esters can also be grafted together with other ethylenically unsaturated and copolymerizable monomers, such as maleic acid, itaconic acid, mesaconic acid, crotonic acid, acrylic acid or the esters thereof.

The graft polymers obtained can be converted by hydrolysis, alcoholysis or transesterification into partially or completely saponified products, the degree of hydrolysis being at least about 1 mol %, preferably 70 to 99 mol %, based on the mole number of saponifiable monomer units in the graft polymer. The production of graft polymers with a polyurethane graft backbone chain is described in German Patent Application P 37 32 089.

In general, the photosensitive mixture according to the invention contains about 20 to 95 and preferably 30 to 70% by weight of this binder.

Photoinitiators which can be used for the mixture according to the invention are the known compounds which display an adequate thermal stability during processing of the recording materials and also adequate formation of free radicals on exposure, with initiation of the polymerization of the monomers. They should absorb light in the wavelength range of about 250 to about 500 nm with the formation of free radicals. Examples of suitable photoinitiators are acyloins and their derivatives, such as benzoin, benzoin alkyl ethers, for example benzoin isopropyl ether, vicinal diketones and their derivatives, for example benzil, benzil acetals, such as benzil dimethyl ketal, fluorenones, thioxanthones, polynuclear quinones, acridines and quinoxalines; and also trichloromethyl-s-triazines, 2-halogenomethyl-4-vinyl-1,3,4-oxadiazolederivatives, halogenooxazoles substituted by trichloromethyl groups, carbonylmethylene-heterocyclic compounds containing trihalogenomethyl groups, in accordance with DE-A 33 33 450, acylphosphine oxide compounds, such as are described, for example, in DE-A 31 33 419 and other phosphorus-containing photoinitiators, for example the 6-acyl-(6H)-dibenz-[c,e][1,2]-oxaphosphorine-6-oxides, in particular 6-(2,4,6-trimethylbenzoyl)-(6H)-dibenz-[c,e] [1,2]-oxaphosphorine-6-oxide, described in the earlier German Patent Application P 38 27 735.2. The photoinitiators can also be used in combination with one another or with coinitiators or activators, for example, with Michler's ketone and its derivatives or 2-alkylanthraquinones. The amount of photoinitiator is in general about 0.01 to 10, preferably about 0.5 to 5% by weight of the photosensitive mixture.

Frequently it is of advantage also to add further auxiliaries and additives to the recording material, for example thermal polymerization inhibitors, such as hydroquinone and its derivatives, 2,6-di-tert.-butyl-p-cresol, nitrophenols, nitrosamines such as N-nitrosodiphenylamine or salts of N-nitrosocyclohexylhydroxylamine, for example the alkali metal or aluminum salts thereof. Further customary additives are dyes, pigments, processing auxiliaries and plasticizers.

For the production of relief and flexographic printing plates, the mixture according to the invention can be shaped to layers from about 0.02 to 6, preferably from 0.2 to 2 mm thick by casting from solution or extruding and calendering. The layer can be laminated onto the surface of a suitable support, or a solution of the mixture according to the invention can be applied to a layer support to obtain a recording material.

As well as for the production of relief printing plates, the recording material according to the invention prepared in the above way can also be used, for example, for the production of planographic printing plates, photogravure cylinders, screen printing stencils and photoresists.

Suitable supports are, depending on the intended use, for example polyester films, steel or aluminum sheets, copper cylinders, screen printing stencil supports, foam layers, rubber-elastic supports or circuit boards. It may also be advantageous to apply a cover or protective coating, for example a thin coating of polyvinyl alcohol, or a peelable cover film, for example of polyethylene glycol terephthalate, to the photosensitive recording layer. Furthermore, a pre-coating of the support can be advantageous. The additional coating between the support and the photosensitive layer can act, for example, as an antihalo protective layer or as an adhesive layer.

The recording material according to the invention can be exposed image-wise using actinic light from light sources such as mercury vapor lamps or fluorescent tubes, the wave-length emitted preferably being between about 300 and 420 nm. The removal of the non-exposed and non-crosslinked portions of the layer can be effected by spraying, rinsing or brushing with water or aqueous solutions, for example of wetting agents or emulsifiers. Furthermore, small amounts of anti-foaming agents or water-miscible organic solvents, for example lower aliphatic alcohols, can be added to the solution. The proportion of organic solvents is in general less than 10%, preferably less than 5%. Appropriately, the developed relief forms are dried at temperatures of up to 120° C. and optionally postexposed, at the same time or subsequently, using actinic light.

The recording materials according to the invention are particularly suitable for the production of printing forms, in particular letter press printing or relief printing forms, which are particularly suitable for flexographic printing.

The invention is illustrated by the following Examples. The limiting viscosity numbers $J_o$ (in ml/g) were determined at 25° C. in an Ostwald viscometer. The degrees of hydrolysis (in mol %) relate to the hydrolyzable monomer units in the unsaponified graft polymer. The hardness, indicated in Shore A units, was determined according to DIN standard 53 505.

Preparation of the graft polymer

Synthesis of the polyurethane graft backbone chain 3,000 g of polyethylene glycol 600 and 193.1 g of 1,4-butane-diol are heated together with 1.5 ml of 1,4-dimethylpiperazine to 75° C. and 1428.2 g of isophorone diisocyanate are added in the course of 6 hours. The mixture is then allowed to react for a further two hours at 80° C. $J_o$ of the polyurethane prepared in this way is 10.6 in methanol.

Synthesis of the graft polymer 2,370 g of the polyurethane graft backbone are warmed to 80° C. and a mixture of 3,555 g of vinyl acetate and 26.7 of dibenzoyl peroxide (75% strength) is added in the course of 5 hours, with stirring. After a further reaction time of 45 minutes at 80° C., unconverted vinyl acetate is removed by azeotropic distillation with methanol. $J_o$ of the graft polymer prepared in this way is 16.8 in THF.

Saponification of the graft polymer 198 g of 10% methanolic NaOH and 198 g of water are added at room temperature to 10,258 g of a 50% methanolic solution of the graft polymer. The mixture gels after some time and is granulated. After two hours, the resulting granules are slurried in methanol and an amount of acetic acid equivalent to the NaOH is added. The product is filtered off, washed several times with methanol dried. $J_o$ is 10.0 in water and the degree of hydrolysis is 90.6%.

Application Example 1

57.4 parts by weight of the saponified graft polymer described in the Preparation Example, 37.8 parts by weight of diethylene glycol monoethyl ether monoacrylate, 2 parts by weight of trimethylolpropane triacrylate, 2 parts by weight of benzil dimethyl ketal and 0.8 part by weight of 2,6-di-tert.-butyl-4-methylphenol are homogenized in a twin screw extruder at 160° C. to give a transparent melt and the melt is then pressed hot in a plate press between a 0.125 mm thick polyester film and a 0.3 mm thick anodically oxidized aluminum sheet, which has been provided with a polyurethane adhesive layer, at 155° C. for two minutes to give a 0.8 mm thick layer. After peeling off the polyester film, the layer is exposed for three minutes image-wise using a UVA flat exposure apparatus and developed for three minutes with water at 40° C. After drying, a relief printing plate with a Shore A hardness of 58 is obtained.

Application Example 2

Analogously to Application Example 1, 57.4 parts by weight of the saponified graft polymer prepared in accordance with the Preparation Example, 37.8 parts by weight of diethylene glycol monomethyl ether monoacrylate, 2 parts by weight of trimethylolpropane triacrylate, 2 parts by weight of benzil dimethyl ketal and 0.8 part by weight of 2,6-di-tert.-butyl-4-methylphenol are homogenized and processed to give a relief printing plate. The crosslinked photopolymer layer has a Shore A hardness of 47.

Application Example 3

Analogously to Application Example 1, 57.4 parts by weight of the saponified graft polymer prepared as described in the Preparation Example, 37.8 parts by weight of diethylene glycol monomethyl ether monomethacrylate, 2 parts by weight of trimethylolpropane triacrylate, 2 parts by weight of benzil dimethyl ketal and 0.8 part by weight of 2,6-di-tert.-butyl-4-methylphenol are homogenized and processed to give a relief printing plate. The crosslinked photopolymer layer has a Shore A hardness of 58.

Application Example 4

Analogously to Application Example 1, 57.4 parts by weight of the saponified graft polymer prepared in accordance with the Preparation Example, 37.8 parts by weight of triethylene glycol monomethyl ether monoacrylate, 2 parts by weight of trimethylolpropane triacrylate, 2 parts by weight of benzil dimethyl ketal and 0.8 part by weight of 2,6-di-tert.-butyl-4-methylphenol are homogenized and processed to give a relief printing plate. The crosslinked photopolymer layer has a Shore A hardness of 52.

Application Example 5

Analogously to Application Example 1, 57.4 parts by weight of the saponified graft polymer prepared in accordance with the Preparation Example, 37.8 parts by weight of 1,2-propanediol monomethyl ether monoacrylate, 2 parts by weight of trimethylolpropane triacrylate, 2 parts by weight of benzil dimethyl ketal and 0.8 part by weight of 2,6-di-tert.-butyl-4-methylphenol are homogenized and processed to give a relief printing plate. The crosslinked photopolymer layer has a Shore A hardness of 55.

Comparative Example 1

Analogously to Application Example 1, 57.4 parts by weight of the saponified graft polymer prepared in accordance with the Preparation Example, 37.8 parts by weight of diethylene glycol monoacrylate, 2 parts by weight of trimethylolpropane triacrylate, 2 parts by weight of benzil dimethyl ketal and 0.8 part by weight of 2,6-di-tert.-butyl-4-methylphenol are homogenized and processed to give a relief printing plate. The crosslinked photopolymer layer has a Shore A hardness of 71.

Comparative Example 2

Analogously to Application Example 1, 57.4 parts by weight of the saponified graft polymer described in the Preparation Example, 37.8 parts by weight of polyethylene glycol monomethyl ether monomethacrylate (Bisomer MPEG (350) MA made by BP Chemicals Ltd., having an average of eight $CH_2CH_2O$ units), 2 parts by weight of trimethylolpropane triacrylate, 2 parts by weight of benzil dimethyl ketal and 0.8 part by weight of 2,6-di-tert.-butyl-4-methylphenol are homogenized and processed to give a relief printing plate. The unexposed photopolymer layer shows a visible haze. As a consequence thereof, the relief formation is considerably worse than in Application Example 3.

What is claimed is:

1. A photocurable elastomeric mixture comprising:
    a) about 20 to 95% by weight of an elastomeric graft polymer binder which comprises
        i) a polyurethane graft backbone, comprising a plurality of diol and diisocyanate units, having at least 2 urethane groups, and
        ii) a plurality of carboxylic acid vinyl ester units having about 3 to 20 carbon atoms, or saponification products thereof, grafted to said graft backbone,
    said graft polymer being soluble or dispersible in water or aqueous solution,
    b) about 5 to 70% by weight of at least one compound comprising at least one terminal ethylenically unsaturated group and having a boiling point at normal pressure of about 100° C., which is polymerizable by free-radical polymerization and which is compatible with said binder (a), and
    c) about 0.01 to 10% by weight of a compound or combination of compounds capable of initiating polymerization of said compound or compounds (b) under the action of actinic radiation,
    wherein at least one said compound (b) corresponds to the formula

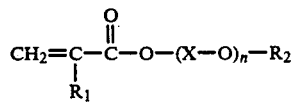

where
R$_1$ denotes hydrogen or alkyl,
X denotes ethylene or propylene,
R$_2$ denotes alkyl and
n is a number from 1 to 4.

2. A photocurable mixture as claimed in claim 1, wherein said graft polymer further comprises a plurality of ethylenically unsaturated units or saponification products thereof grafted to said graft backbone.

3. A photocurable mixture as claimed in claim 1, wherein $R_1$ denotes hydrogen or ($C_1$ to $C_3$)alkyl and $R_2$ denotes ($C_1$ to $C_3$)alkyl.

4. A photocurable mixture as claimed in claim 1, wherein $R_1$ denotes hydrogen or methyl, X denotes ethylene or isopropylene and $R_2$ denotes methyl or ethyl.

5. A photocurable mixture as claimed in claim 1, having a Shore A hardness of about 40 to 70.

6. A photocurable mixture as claimed in claim 5, having a Shore A hardness of 45 to 65.

7. A photocurable mixture as claimed in claim 1, wherein said graft polymer comprises about 10 to 95% by weight of grafted-on constituents.

8. A photocurable mixture as claimed in claim 1, wherein said diisocyanate is an aliphatic or cycloaliphatic diisocyanate.

9. A photocurable mixture as claimed in claim wherein said diol is a mixture of a polyetherdiol and a monomeric diol.

10. A photocurable mixture as claimed in claim 9, wherein about 0.1 to 0.7 mol of monomeric diol are employed per mol of polyetherdiol.

11. A photocurable mixture as claimed in claim 1, wherein the molar ratio of diol component to diisocyanate component is about 1:0.99 to 1:0.5.

12. A photocurable mixture as claimed in claim 1, wherein units of vinyl esters having 4 to 14 carbon atoms are grafted on.

13. A photocurable mixture as claimed in claim 1, wherein the graft polymer has been saponified to the extent of about 70 to 99 mol %, based on the number of saponifiable monomer units.

14. A photocurable mixture as claimed in claim 1, which comprises about 30 to 70% by weight of graft polymer, about 10 to 50% by weight of polymerizable compounds and about 0.5 to 5% by weight of photopolymerization initiator.

15. A photocurable recording material comprising a layer support and a photocurable layer, wherein the photocurable layer comprises a mixture as claimed in claim 1.

16. A photocurable recording material as claimed in claim 15, further comprising an adhesive layer between said support and said photocurable layer.

17. A photocurable recording material as claimed in claim 15, further comprising an antihalo protective layer between said support and said photocurable layer.

18. A photocurable mixture as claimed in claim 1, wherein as component b) a mixture of free-radical polymerizable monomers is employed, wherein the ratio of monomers corresponding the general formula I to the remaining monomers of the mixture is in the range from about 2:1 to 25:1.

* * * * *